(12) United States Patent
Gao

(10) Patent No.: US 12,219,741 B2
(45) Date of Patent: Feb. 4, 2025

(54) SERVER RACK USING A PASSIVE INTERNAL RETURN LOOP FOR TWO-PHASE FLUID COOLING

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 307 days.

(21) Appl. No.: 17/680,665

(22) Filed: Feb. 25, 2022

(65) Prior Publication Data

US 2023/0276602 A1 Aug. 31, 2023

(51) Int. Cl.
*H05K 7/20* (2006.01)

(52) U.S. Cl.
CPC ..... *H05K 7/20818* (2013.01); *H05K 7/20318* (2013.01); *H05K 7/20327* (2013.01)

(58) Field of Classification Search
CPC .......... H05K 7/20781; H05K 7/20772; H05K 7/203; H05K 7/20236; H05K 7/20836; H05K 7/20272; H05K 7/20727; H05K 7/20818; H05K 5/067; H05K 7/1488; H05K 7/20281; H05K 7/20318; H05K 7/20327; H05K 7/20709; H05K 7/1421; H05K 7/20254; H05K 7/20345; G06F 1/20; G06F 2200/201; G06F 1/206; G06F 1/181; G06F 1/187; F28D 1/02; F28D 7/0025; F28D 7/16

USPC .................................................... 361/679.53
See application file for complete search history.

(56) References Cited

U.S. PATENT DOCUMENTS

| | | | |
|---|---|---|---|
| 7,841,392 B1 * | 11/2010 | Short, Jr. ................ | H01Q 1/02 343/893 |
| 2013/0032310 A1 * | 2/2013 | Jaena .................... | H05K 7/1497 165/138 |
| 2013/0284405 A1 * | 10/2013 | Muir ...................... | F28D 15/02 165/104.21 |
| 2014/0123493 A1 * | 5/2014 | Campbell ................ | F28F 3/12 29/890.03 |
| 2016/0066480 A1 * | 3/2016 | Eckberg .................. | F16L 37/34 361/679.53 |
| 2023/0309271 A1 * | 9/2023 | Gao .................... | H05K 7/20818 |
| 2023/0354560 A1 * | 11/2023 | Gao .................... | H05K 7/20809 |

* cited by examiner

Primary Examiner — Mandeep S Buttar
(74) Attorney, Agent, or Firm — WOMBLE BOND DICKINSON (US) LLP

(57) ABSTRACT

The present disclosure provides apparatus, systems, methods, and techniques for cooling using a passive internal return loop with two-phase fluids. The cooling techniques may be applied to an advanced server rack having high power density servers. The server rack may be either packaged with one or more cooling modules or employ a fully sealed immersion configuration. For example, coolant in the vapor state may be separated from coolant in the liquid state in the two-phase coolant, and the coolant in the liquid state may be recirculated to cool the server (or other sub cooling systems) by gravity (i.e., pump-free).

18 Claims, 8 Drawing Sheets

SERVER RACK USING A PASSIVE INTERNAL RETURN LOOP FOR TWO-PHASE FLUID COOLING

FIELD

This disclosure generally relates to cooling, such as two phase fluid cooling.

BACKGROUND

Cooling (e.g., removing heat, often excessive or unwanted heat) is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. The data centers therefore often require effective and efficient cooling solutions, especially in the cases of cooling these high performance servers.

Cooling operation efficiency may be measured by the amount of heat removed divided by the input energy required for removing the amount of heat. Therefore, the less input energy is consumed for removing the same amount of heat, the more efficient the cooling solution is.

BRIEF DESCRIPTION OF THE DRAWINGS

Embodiments of the present disclosure are illustrated by way of example and not limitation in the figures of the accompanying drawings in which like references indicate similar elements.

Like numerals indicate like elements.

DETAILED DESCRIPTION

Figure 1:
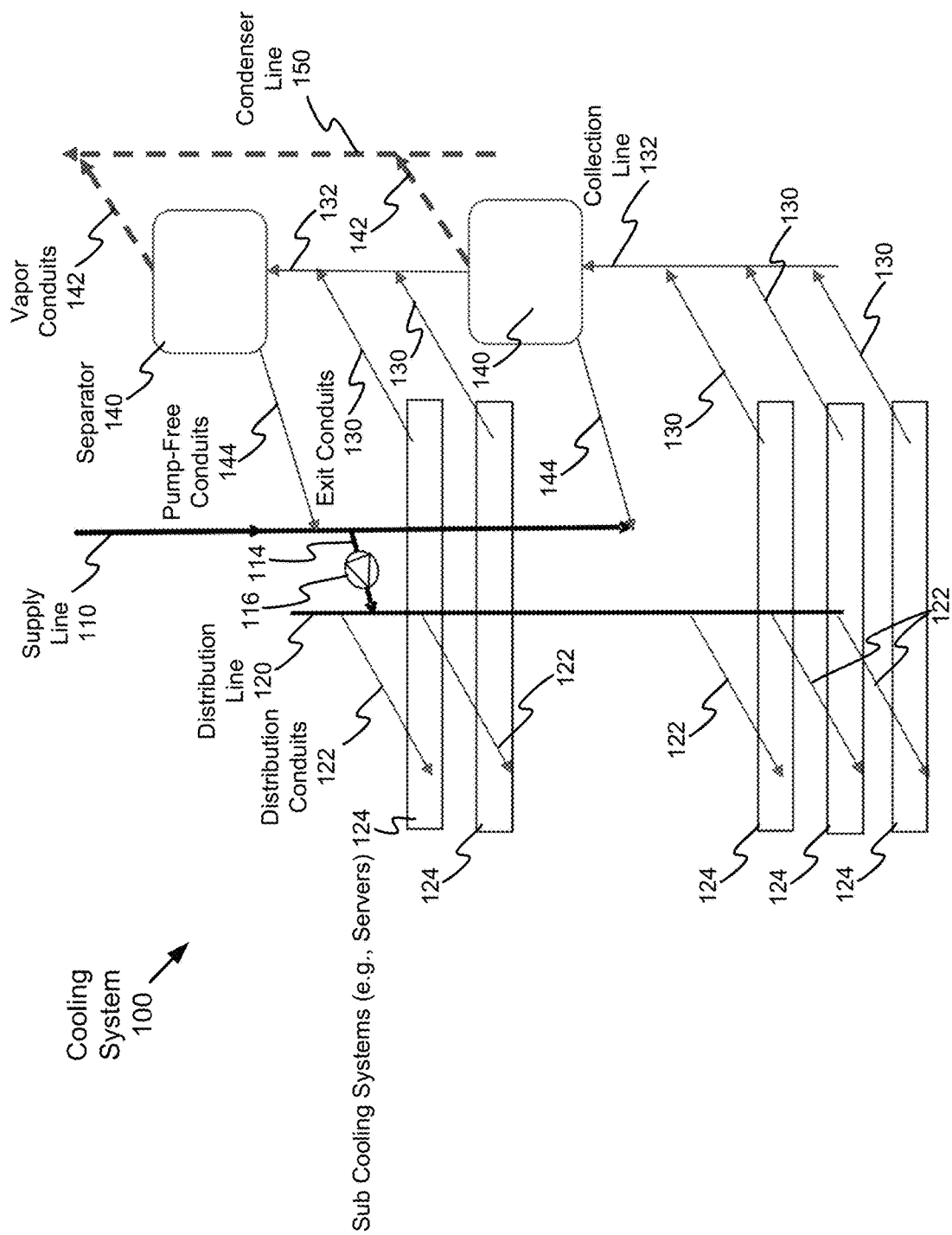
FIG. 1 illustrates a first example schematic of a cooling system using passive internal return loop, according to an embodiment of the present disclosure.

Various embodiments and aspects of the present disclosures will be described with reference to details discussed below, and the accompanying drawings will illustrate the various embodiments. The following description and drawings are illustrative of the present disclosure and are not to be construed as limiting the present disclosure. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the present disclosure. The appearances of the phrase "in one embodiment" in various places in the specification do not necessarily all refer to the same embodiment.

The present disclosure provides apparatus, systems, methods, and techniques for cooling using a passive internal return loop with two-phase fluids. For example, coolant in the vapor state may be separated from coolant in the liquid state in the two-phase coolant, and the coolant in the liquid state may be recirculated to cool the server (or other sub cooling systems) by gravity (i.e., pump-free). The cooling techniques may be applied to an advanced server rack having high power density servers. In some cases, the disclosed design may be used for distributing two phase coolant to servers with either cooling plate/cooling module or the server is immersion based packaged. As the cooling operation efficiency may be improved by reducing or minimizing the required energy for operation, the present disclosure provides techniques for passively returning coolant with minimal energy input, thus improving the overall operation efficiency.

The disclosed highly efficient passive coolant return configuration may be implemented to various types of data centers, flexible for various deployment scales, and improve facility cooling efficiency overall, as active coolant return requires power expenditure that generates heat separately. The disclosed configurations are compatible with existing rack and server configurations and improves two-phase coolant management. Herein, coolant refers to cooling fluids that may be in one or more matter states, such as in liquid, gas or vapor, or a mixture thereof. In some examples, the proposed configuration improves separation of various states of the coolant, further improving cooling efficiency. The passive coolant return configuration, which does not require coolant to first return to the source coolant supply, may reduce the required mount for the source coolant supply. Further, the passive internal return loop accommodates discrepancies in rack power densities (e.g., adaptively handling different local heat production in the server rack).

Two-phase cooling systems use the latent heat absorbed by the coolant when the coolant transforms from the liquid state into the vapor state, without requiring a change in temperature. For example, the coolant may have a low boiling point of 50 degrees Celsius. When the coolant (originally in liquid state) contacts the component to be cooled, a portion of the coolant is transformed into the vapor state to absorb the heat from the component, while maintaining the overall temperature (e.g., at the boiling point of the coolant). When excessive heat is produced, more coolant in the liquid state is required. This may be achieved by increasing the pumping speeds of the coolant from the supply line. However, when heat is produced with large discrepancy at different components or servers in the same rack (e.g., powered by the same supply pump), requiring an overall increase in the coolant feed rate would be unnecessary and wasteful. The present disclosure allows the coolant that is still in the liquid state to passively flow back to join the coolant from the supply line, thus providing flexibility of heat absorption capacity without requiring any changes in the pump feed rate. As such, the pump speeds may also be set at an economical/efficient level, improving overall operation efficiency. In this disclosure, the vapor state may refer to any gaseous state.

Existing two-phase cooling systems often do not separate the coolant in different matter states in one loop. For example, in one circulation loop or cycle, the coolant, which includes a mixture of liquid and vapor states, is transferred to a radiator or condenser and returned to the source coolant supply before being used in the next circulation cycle. Because vapor is the coolant in the gas phase at a temperature lower than the critical temperature and may be condensed to the liquid state by increasing pressure on the vapor without a change of temperature, the present disclosure provides systems and methods for passively separating the coolant in vapor state and in liquid state within a circulation cycle, and allows the coolant in liquid state to passively return to the coolant supply bypassing condensers or radiators to achieve the advantages mentioned above.

According to aspects of the present disclosure, an example two-phase fluid cooling system may include distribution lines distributing the coolant from a supply line to each cooling system of a corresponding server. A pump-free (e.g., pump-less, such as gravity driven) return line may intersect the distribution lines such that not all liquid phase coolant is required from the supply line. The return line may return the coolant which is un-vaporized and still in liquid state within a circulation cycle, thus improving coolant usage and management efficiency.

In an example aspect, an electronic rack includes a supply manifold to receive a coolant from a source to distribute the coolant to one or more server chassis. Each of the server chassis contains one or more electronic devices. The coolant operates to remove heat from the one or more electronic devices by transforming into a two-phase fluid comprising a liquid portion and a non-liquid portion. The electronic rack further includes one or more exit manifolds to receive the two-phase fluid having passed through one or more server chassis. The electronic rack may further include a separator disposed on an end of the one or more exit manifolds to receive the two-phase fluid therefrom. The electronic rack includes a pump-free conduit connecting the separator and the supply manifold for transferring, using gravity, the liquid portion of the two-phase fluid to the supply manifold. The liquid portion joins the coolant for a next heat removal cycle.

In some embodiments, the electronic rack further includes a distribution conduit interfacing with the one or more server chassis; and a pump connecting the distribution conduit and the supply manifold. The pump is configured to power the coolant through the distribution conduit and the one or more exit manifolds of the one or more server chassis. For example, the pump may cause a relatively low pressure in the supply manifold to draw the liquid portion of the two-phase fluid from the separator.

In some embodiments, the electronic rack may further include a condenser conduit coupled to the separator to receive the non-liquid portion and transfer the non-liquid portion for heat exchange. The non-liquid portion is in a gaseous matter state, such as a vapor state.

In some embodiments, the electronic rack may further include a server-chassis-specific pump connecting the supply manifold and one of the one or more server chassis.

In some embodiments, the electronic rack may further include a pump-free supply line connecting the supply manifold and one of the one or more server chassis to provide the one of the one or more server chassis a portion of the coolant using gravity.

In some embodiments, the coolant in the supply manifold is at a substantially similar temperature as the liquid portion of the two-phase fluid.

Details of the schematics and illustrative configurations are discussed below.

FIG. 1 illustrates a first example schematic of a cooling system 100 using passive internal return loop, according to an embodiment of the present disclosure. As shown, a supply line 100 provides coolant from a supply source (not shown) to the cooling system 100. Coolant in the supply line 100 is transferred to a distribution line 120 via a supply conduit 114 and a supply pump 116. The distribution line 120 respectively transfers coolant to one or more sub cooling systems 124 via one or more distribution conduits 122. For example, the one or more sub cooling systems 124 may be included in one or more computer servers, processing devices, or one or more heat-producing devices. Each of the one or more sub cooling systems 124 include a cooling module that uses the coolant to remove heat, turning the coolant into a two-phase mixture including both liquid and vapor states (referred to as coolant). The coolant is transferred to one or more separators 140 via one or more exit conduits 130 (e.g., connectors, couplings, and/or associated tubing and the like) and a collection line 132.

The separators 140 may use the density differences between the liquid and vapor states of the coolant to separate the coolant in these different states, e.g., without actively changing the pressure or temperature of the coolant. The coolant in the vapor state is transferred to a condenser line 150 via one or more vapor conduits 142, to release the absorbed heat into an external environment and return to the liquid state, and to return to the coolant supply source thereafter. The coolant in the liquid state is returned to the supply line 110 via one or more pump-free conduits 144.

The one or more pump-free conduits 144 connects the separator 140 and the supply line 110 for transferring the coolant in the liquid state using gravity to be used in the next heat removal cycle. Although the example pump-free conduits 144 are illustrated to use gravity to return the liquid coolant to the supply line 100, in some instances, the pump-free conduits 144 may use other passive mechanisms or physics principles, such as surface tension or density variations, to passively (e.g., without the use of a powered device, such as a pump) return the liquid coolant to the supply line 100 in the current circulation cycle.

The separator 140, the vapor conduits, and/or the condenser line 150 may, in some cases, actively transfer the coolant in the vapor state to an external condenser (not shown) to return the coolant to the supply source in liquid state. For example, a low pressure may be created to move the vapor away from the separator 140. In some cases, the separator 140 may increase the pressure of the vapor to push the coolant in vapor state to the condenser.

Figure 2:
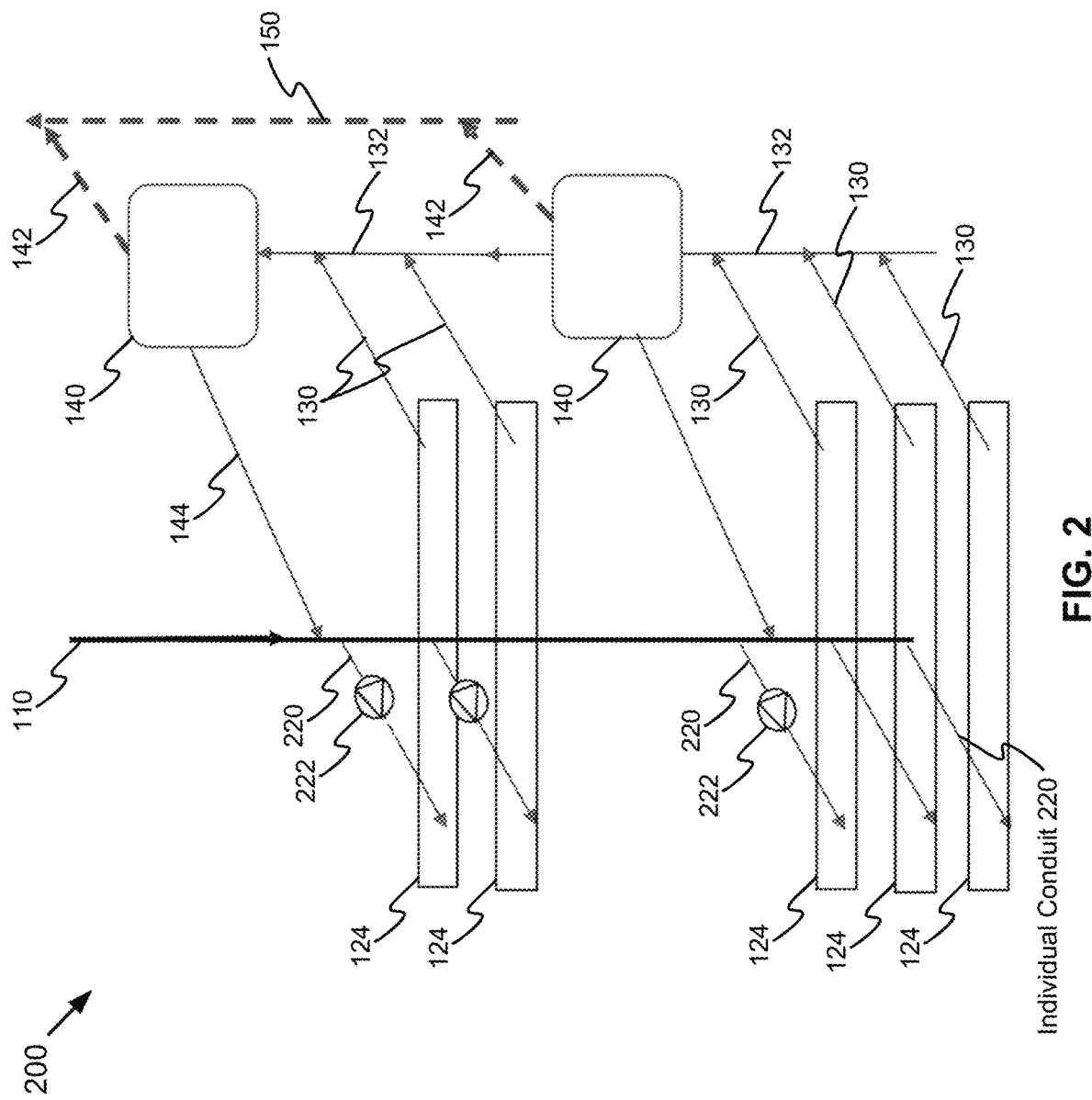
FIG. 2 illustrates a second example schematic of a cooling system using passive internal return loop, according to an embodiment of the present disclosure.

FIG. 2 illustrates a second example schematic of a cooling system 200 using passive internal return loop, according to an embodiment of the present disclosure. As shown, instead of using a central pump such as the pump 116 to transfer coolant from the supply line 110 to the distribution line 120 as in FIG. 1, each of the one or more sub cooling systems 124 receives coolant from the supply line 110 directly via an individual distribution conduit 220. The individual conduit 220 may include a respective supply pump 222 for providing the coolant from the supply line 110 to the one or more sub cooling systems 124. In some cases, the individual conduit 220 may apply similar physics principles as the pump-free conduits 144 to passively supply coolant to the sub cooling systems 124. For example, the individual conduit 220 may be pump-free or pump-less and transfer coolant from the supply line 110 to one or more of the sub cooling systems 124 by gravity.

As shown in FIG. 2, because the distribution line 120 is not used as compared to the first example in FIG. 1, the pump-free conduits 144 may return the coolant in liquid state from the separators 140 to the individual conduits 220 via the supply line 110. As such, the liquid portion of the coolant may be circulated continuously within the cooling system 200 until transformed into the vapor state. The cooling system 200 may therefore be scaled up without complicating control management when another set of the cooling system 200 is added to the supply line 110.

Figure 3:
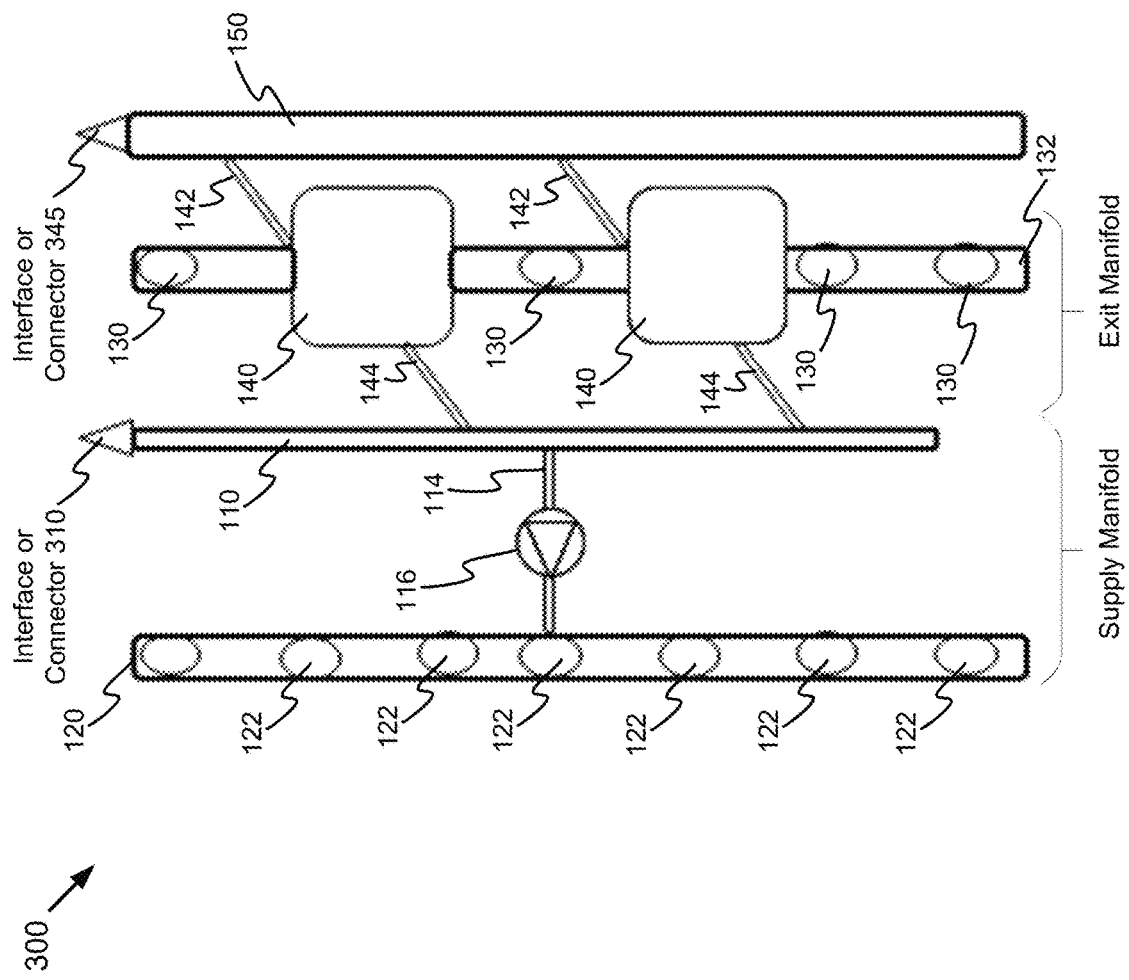
FIG. 3 illustrates an example hardware implementation of the first example schematic of FIG. 1, according to an embodiment of the present disclosure.

FIG. 3 illustrates an example hardware implementation of the first example schematic of FIG. 1, according to an embodiment of the present disclosure. As shown, the cooling system assembly 300 may be integrated to existing computer server racks by use of a supply manifold that includes the supply line 110, the distribution line 120, and a number of distribution conduits 122 (e.g., connectors, and/or any associated tubing or couplings that allow fluids to flow through). The distribution conduits 122 are coupled with respective server racks or chassis. The supply line 110 may be coupled to a coolant source (not shown) via a detachable interface or connector 310. Similarly, the condenser line 345 may be coupled to a condenser (not shown) via a detachable interface or connector 345. This way, the cooling system assembly 300 may be conveniently added to any server racks or data center for deployment.

The collection conduit 132 and the one or more exit conduits 130 may be implemented in an exit manifold, as shown in FIG. 3. In some cases, the exit manifold may include detachable exit conduits 130 for ease of configuration (e.g., adding or removing some of the exit conduits 130). Similarly, the exit manifold may be coupled with a variable number of separators 140 using re-sealable or re-configurable connectors or interfaces. Depending on processing bandwidth, one or more separators 140 may be added or removed from the cooling system assembly 300.

Figure 4:
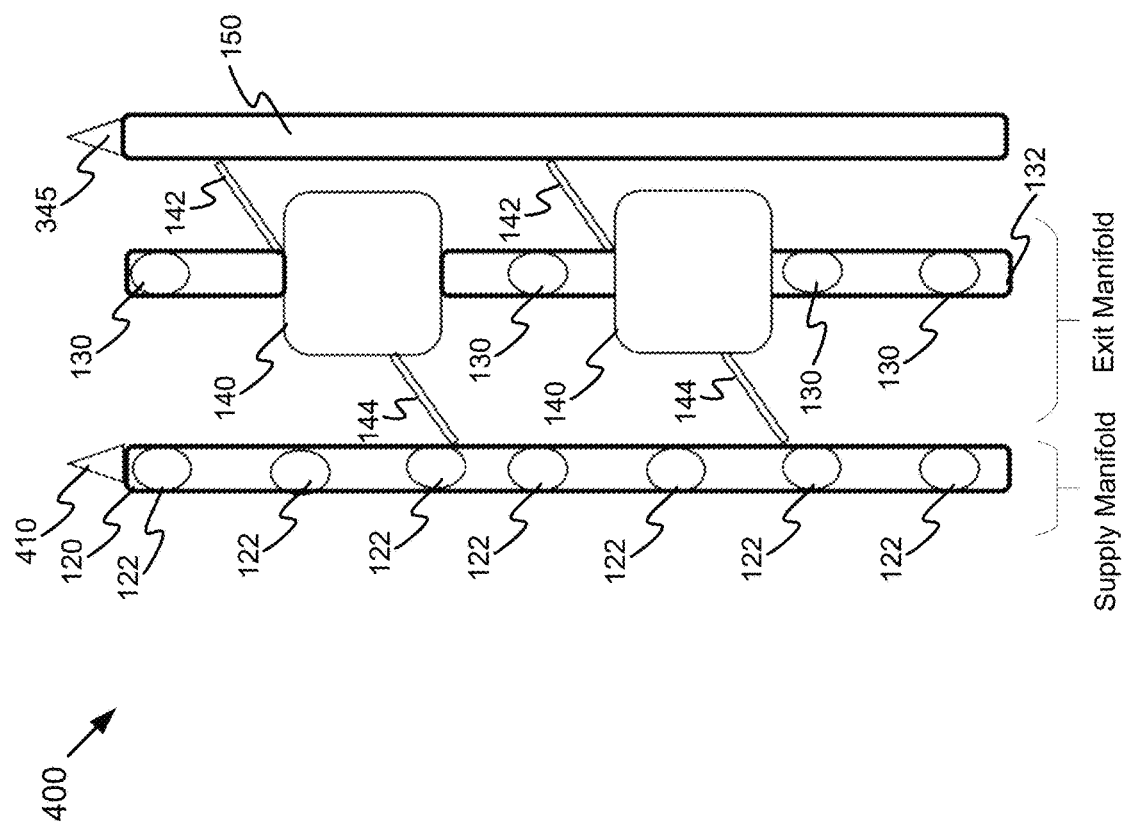
FIG. 4 illustrates an example hardware implementation of the second example schematic of FIG. 2, according to an embodiment of the present disclosure.

FIG. 4 illustrates an example hardware implementation of the second example schematic of FIG. 2, according to an embodiment of the present disclosure. As shown, the cooling system assembly 400 allows the separators 140 to directly return the liquid portion of the coolant to the supply manifold, which includes the distribution line 120 and the distribution conduits 122 in this example. The supply manifold may be coupled to a coolant source (not shown) via a detachable interface or connector 410.

Figure 5:
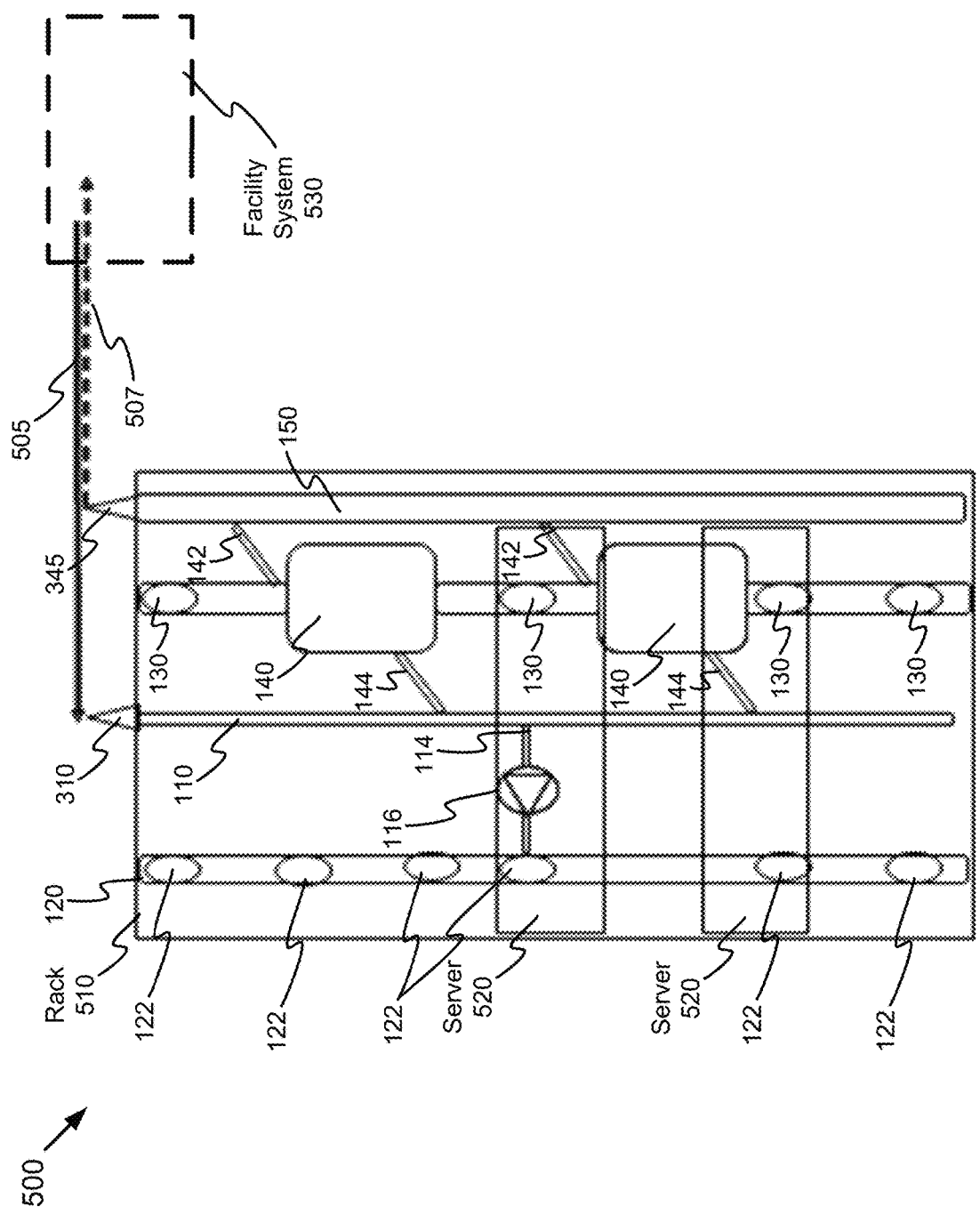
FIG. 5 illustrates an example server rack using passive internal return loop, according to an embodiment of the present disclosure.

FIG. 5 illustrates an example server rack 510 using passive internal return loop, according to an embodiment of the present disclosure. The server rack 510 may receive coolant from and transfer the vaporized coolant to the facility system 530, which includes the coolant supply source and the condenser for returning the coolant vapor into liquid. The server rack 510 and the facility system 530 may form a part of a cooling system 500 for a data center, which includes a number of other server racks similar to the server rack 510. The other server racks may also be connected to the facility system 530 to obtain and return the two-phase coolant.

As shown in FIG. 5, multiple servers 520 mounted on a server rack 510 receives the coolant from the distribution conduits 122. Each of the server 520 may include a sub cooling system, such as the sub cooling system 124 of FIG. 1 or 2. The pump 116 may deliver the coolant to all servers 520 connected to the supply manifold (e.g., the distribution conduits 122 and the distribution line 120). The supply line 110 is coupled to a system supply line 505 via the connector 310. The condenser line 150 is coupled to a system condenser line 507. Both the system supply line 505 and the system condenser line 507 may allow other cooling systems to respectively receive and return two-phase coolant from and to the facility system 530.

Figure 6:
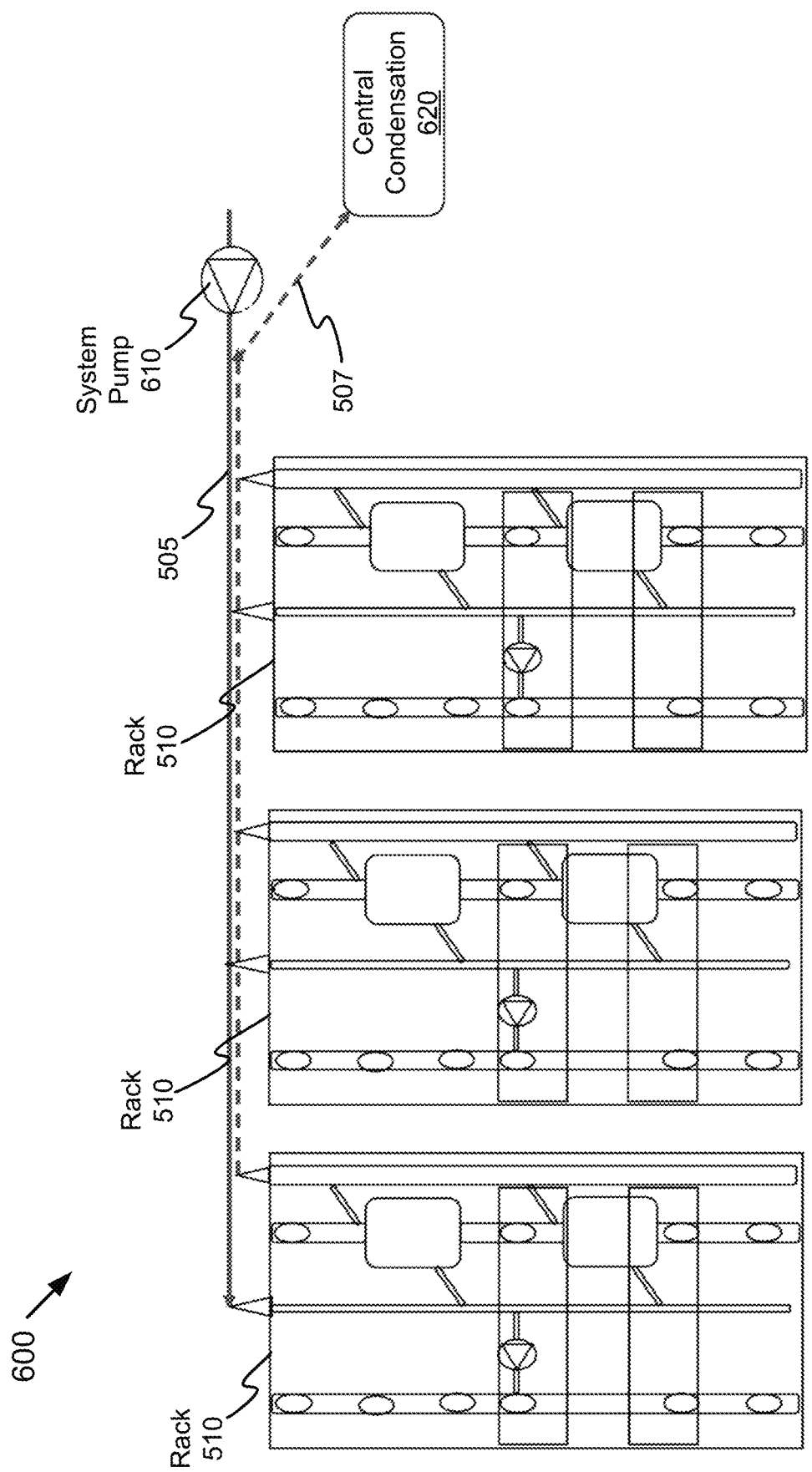
FIG. 6 illustrates an example rack clusters with server racks, according to an embodiment of the present disclosure.

FIG. 6 illustrates an example server rack system 600 using passive internal return loop, according to an embodiment of the present disclosure. As shown, a cluster of server racks 510 may be connected to the system supply line 505 and the system condenser line 507. As such, the advantages of the cooling system 500 may be scaled up, depending on the demand of applications. The server rack system 600 may further include a system pump 610 to provide a system-wide coolant pressure to each server rack 510. Similarly, a central condensation 620 may be used to dispose absorbed heat and return the coolant in the vapor state to the liquid state. The restored coolant is then returned to the coolant source (e.g., a reservoir).

Figure 7:
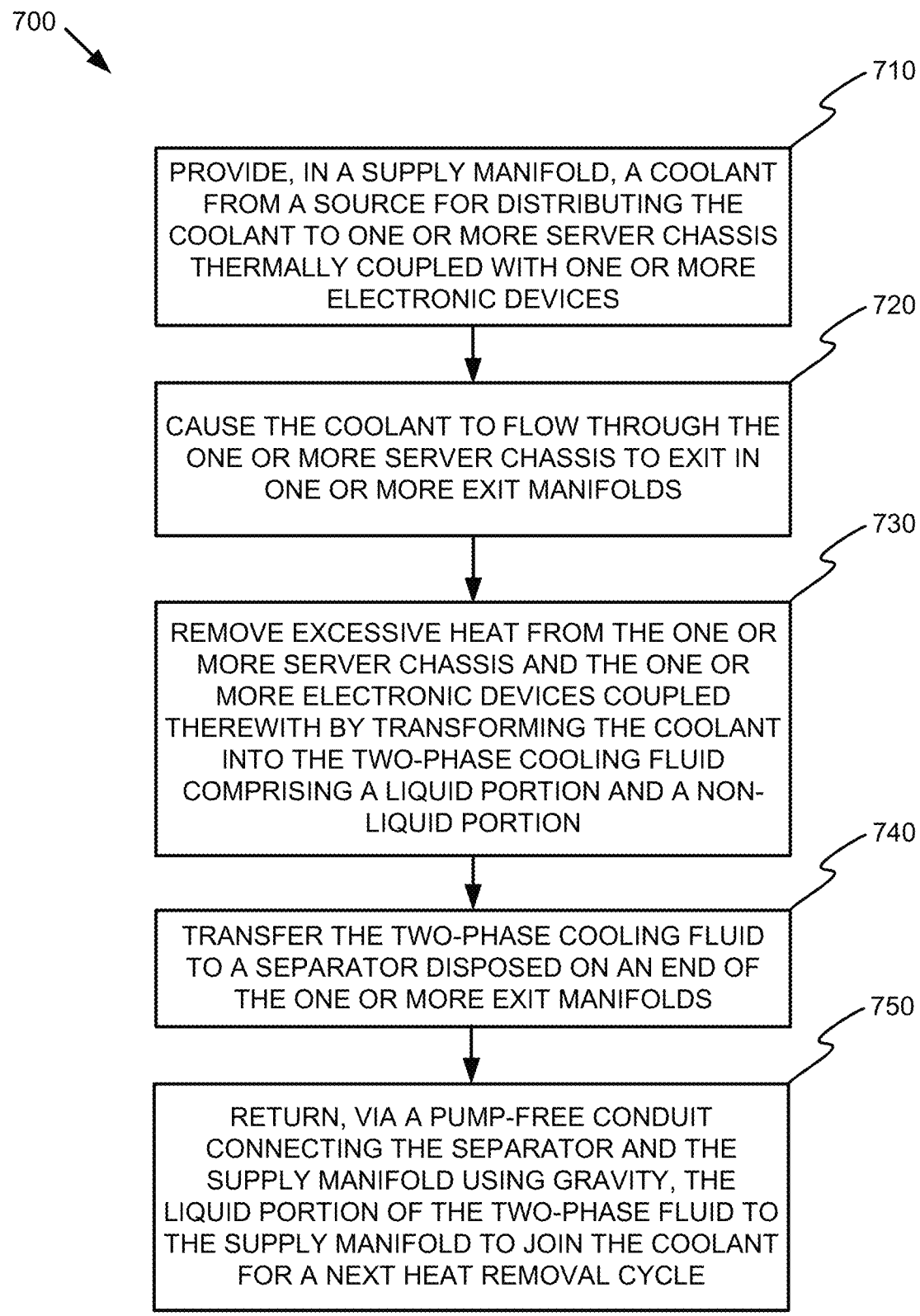
FIG. 7 is a flow chart of example operations of a cooling system, according to an embodiment of the present disclosure.

FIG. 7 is a flow chart of example operations 700 of a cooling system using passive internal return loop, according to an embodiment of the present disclosure. The operations 700 may be performed by a cooling system, such as the cooling system 500 of FIG. 5, to maintain an optimal operation temperature by removing heat in an electronic system.

The operations 700 may begin, at 710, by providing a coolant from a source in a supply manifold for distributing the coolant to one or more server chassis thermally coupled with one or more electronic devices. In some cases, the coolant may be a two-phase fluid having a low boiling temperature (e.g., 50 degrees Celsius).

At 720, the coolant is caused to flow through the one or more server chassis to exit in one or more exit manifolds. For example, the coolant may be powered by a pump connecting a distribution conduit and the supply manifold to pass through the distribution conduit and the one or more exit manifolds of the one or more server chassis. In some cases, the coolant maybe powered by pump-free or pump-less means, such as by the use of gravity, to pass through the one or more server chassis. For example, when the coolant is collected from the one or more exit manifolds, the elevation or pressure of the coolant may be increased to enable the liquid portion to be recirculated.

At 730, excessive heat is removed from the one or more server chassis and the one or more electronic devices coupled therewith by transforming the coolant into the two-phase cooling fluid including a liquid portion and a non-liquid portion (e.g., in a vapor matter state). For example, the coolant absorbs latent heat when transformed from the liquid state into the vapor state, resulting in a mixture of the two-phase fluid.

At 740, the two-phase cooling fluid is transferred to a separator disposed on an end of the one or more exit manifolds. For example, the separator may be the separator 140 of FIG. 1. The one or more exit manifolds may include the multiple exit conduits 130 and the collection line 132. One or more of the separators 140 may be disposed on an end of the collection line 132.

At 750, the liquid portion of the two-phase fluid is returned, via a pump-free conduit connecting the separator and the supply manifold using gravity, to the supply manifold to join the coolant for a next heat removal cycle.

Figure 8:
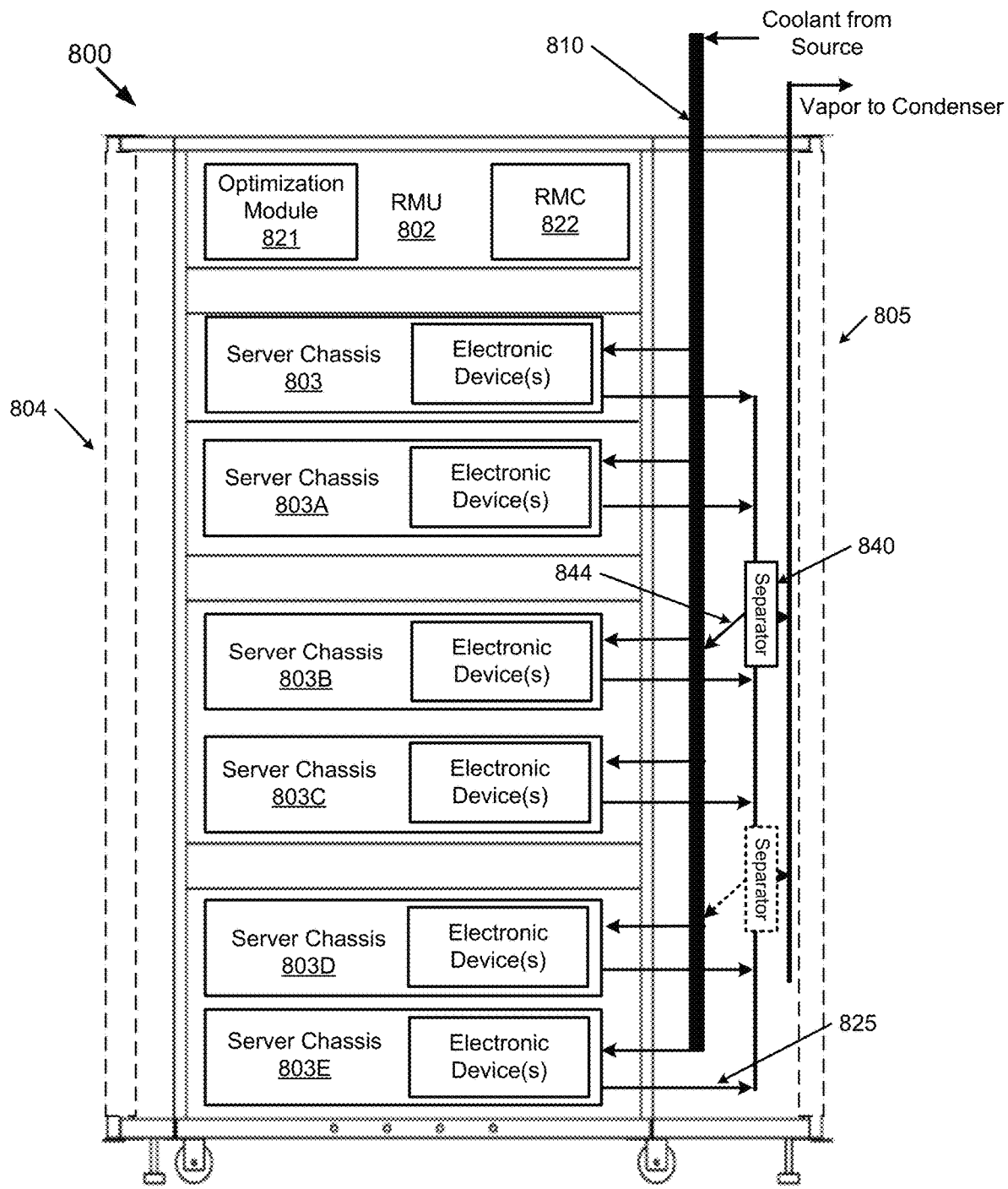
FIG. 8 illustrates a block diagram illustrating an example of an electronic rack according to an embodiment of the present disclosure.

FIG. 8 is block diagram illustrating an electronic rack according to an embodiment of the present disclosure. Electronic rack 800 may represent any of the electronic racks as described throughout this application. According to one embodiment, electronic rack 800 includes, but is not limited to, supply line 810, rack management unit (RMU) 802, and one or more server chassis 803, and 803A-803E (collectively referred to as server chassis 803). Server chassis 803 can be inserted into an array of server slots (e.g., standard shelves) respectively from frontend 804 or backend 805 of electronic rack 800. Each server chassis may include one or more blade slots to receive one or more server blades. Each server blade represents one or more servers therein.

Note that although there are six server chassis 803 shown here, more or fewer server chassis may be maintained within electronic rack 800. Also note that the particular positions of heat exchanger 811, RMU 802, and/or server chassis 803 are shown for the purpose of illustration only; other arrangements or configurations of heat exchanger 811, RMU 802, and/or server chassis 803 may also be implemented. In one embodiment, electronic rack 800 can be either open to the environment or partially contained by a rack container, as long as the cooling fans can generate airflows from the frontend to the backend.

In addition, for at least some of the server chassis 803, an optional fan module (not shown) is associated with the server chassis. Each of the fan modules includes one or more cooling fans. The fan modules may be mounted on the backends of server chassis 803 or on the electronic rack to generate airflows flowing from frontend 804, traveling through the air space of the sever chassis 803, and exiting at backend 805 of electronic rack 800.

In one embodiment, the supply line 810 may provide coolant in liquid phase from a source to the rack 800. In some cases, the supply line 810 may be powered by a pump (not shown) to supply coolant to the server chassis 803. The coolant may be a two-phase coolant. The separator 840 separates the coolant in the vapor state from the coolant in liquid state. The coolant in the liquid state may return to the supply line 810 via a pump-free conduit 840, such as by using gravity, surface tension, or other pump-free means. In some cases, one or more pumps (not shown) may be used between the supply line 810 and one or more individual sub-cooling systems in each of the server chassis 803.

Each of server chassis 803 may include one or more information technology (IT) components (e.g., electronic devices such as processors, memory, and/or storage devices). The coolant removes the heat generated from the electronic device attached thereon. The coolant carrying the exchanged heat exits the server chassis via conduits 825 and reaches one or more separators, which separates the coolant in liquid state from the coolant in vapor state. The coolant in liquid state is returned to the supply line 810 via the pump-free conduits 844.

In another embodiment, some of the server chassis 803 may include an immersion tank containing immersion coolant therein. The electronic devices of the corresponding server(s) are at least partially submerged into the immersion coolant. The immersion coolant may be dielectric cooling fluid, which may be circulated between the immersion tanks and heat exchanger (not shown). The coolant may be a single-phase coolant or two-phase coolant (also referred to as phase-change coolant). The two-phase coolant evaporates from a liquid form into a vapor form when the temperature of the coolant is above a predetermined temperature threshold (e.g., the boiling point of the coolant). The vapor flows upstream via the vapor line associated with one or more separators from the corresponding server chassis to heat exchanger. Heat exchanger may include a condenser (e.g., the central condenser 620 shown in FIG. 6) to condense the vapor from the vapor form back to the liquid form, where the coolant is then supplied back to the server chassis.

Note that some of the server chassis 803 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 825 may include a first rack manifold for single-phase cooling and a second rack manifold for two-phase cooling to be coupled to the same or different server chassis for different types of cooling. Some of the sever chassis 803 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 803 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 800 further includes optional RMU 802 configured to provide and manage power supplied to servers 803 and heat exchanger. RMU 802 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack 800.

In one embodiment, RMU 802 includes optional optimization module 821 and rack management controller (RMC) 822. RMC 822 may include a monitor to monitor operating status of various components within electronic rack 800, such as, for example, computing nodes 803, heat exchanger, and the fan modules. Specifically, the monitor receives operating data from various sensors representing the operating environments of electronic rack 800. For example, the monitor may receive operating data representing temperatures of the processors, coolant, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 802.

Based on the operating data, optimization module 821 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 822 configures the liquid pump and cooling fans of the fan modules based on the optimal pump speeds and fan speeds.

In the foregoing specification, embodiments of the present disclosure have been described with reference to specific exemplary embodiments thereof. It will be evident that various modifications may be made thereto without departing from the broader spirit and scope of the present disclosure as set forth in the following claims. The specification and drawings are, accordingly, to be regarded in an illustrative sense rather than a restrictive sense.

What is claimed is:

1. An electronic rack, comprising:
    a supply manifold to receive a coolant from a source to distribute the coolant to one or more server chassis, each of the server chassis containing one or more electronic devices, wherein the coolant operates to remove heat from the one or more electronic devices by transforming into a two-phase fluid comprising a liquid portion and a non-liquid portion;
    one or more exit manifolds to receive the two-phase fluid having passed through the one or more server chassis;
    a separator disposed on an end of the one or more exit manifolds to receive the two-phase fluid therefrom; and
    a pump-free conduit connecting the separator and the supply manifold for transferring, due to gravity, the liquid portion of the two-phase fluid to the supply manifold; and
    a pump-free supply line connecting the supply manifold and one of the one or more server chassis to provide the one of the one or more server chassis a portion of the coolant using gravity.

2. The electronic rack of claim 1, further comprising:
    a distribution conduit interfacing with the one or more server chassis; and
    a pump connecting the distribution conduit and the supply manifold, the pump to power the coolant through the distribution conduit and the one or more exit manifolds of the one or more server chassis.

3. The electronic rack of claim 2, wherein the pump generates a relatively low pressure in the supply manifold to draw the liquid portion of the two-phase fluid from the separator.

4. The electronic rack of claim 1, further comprising:
    a condenser conduit coupled to the separator to receive the non-liquid portion and transfer the non-liquid portion for heat exchange, wherein the non-liquid portion is in a gaseous matter state.

5. The electronic rack of claim 1, further comprising:
    a server-chassis-specific pump connecting the supply manifold and one of the one or more server chassis.

6. The electronic rack of claim 1, further comprising:
    a pump-free supply line connecting the supply manifold and one of the one or more server chassis to provide the one of the one or more server chassis a portion of the coolant using gravity.

7. The electronic rack of claim 1, wherein the coolant in the supply manifold is at a substantially similar temperature as the liquid portion of the two-phase fluid.

8. A data center cooling system, comprising:
    a fluid supply line to receive cooling fluid from a cooling fluid source;
    a fluid return line to return the cooling fluid to the cooling fluid source;
    a plurality of electronic racks coupled to the fluid supply line and the fluid return line, wherein each of the plurality of electronic racks comprises:
        a supply manifold to receive a coolant from a source to distribute the coolant to one or more server chassis, each of the server chassis containing one or more electronic devices, wherein the coolant operates to remove heat from the one or more electronic devices by transforming into a two-phase fluid comprising a liquid portion and a non-liquid portion;
        one or more exit manifolds to receive the two-phase fluid having passed through the one or more server chassis;
        a separator disposed on an end of the one or more exit manifolds to receive the two-phase fluid therefrom;
        a pump-free conduit connecting the separator and the supply manifold for transferring, using gravity, the liquid portion of the two-phase fluid to the supply manifold; and
        a pump-free supply line connecting the supply manifold and one of the one or more server chassis to provide the one of the one or more server chassis a portion of the coolant using gravity.

9. The data center cooling system of claim 8, wherein each of the plurality of electronic racks further comprises:
    a distribution conduit interfacing with the one or more server chassis; and
    a pump connecting the distribution conduit and the supply manifold, the pump to power the coolant through the distribution conduit and the one or more exit manifolds of the one or more server chassis.

10. The data center cooling system of claim 9, wherein the pump generates a relatively low pressure in the supply manifold to draw the liquid portion of the two-phase fluid from the separator.

11. The data center cooling system of claim 8, wherein each of the plurality of electronic racks further comprises:
    a condenser conduit coupled to the separator to receive the non-liquid portion and transfer the non-liquid portion for heat exchange, wherein the non-liquid portion is in a gaseous matter state.

12. The data center cooling system of claim 8, wherein each of the plurality of electronic racks further comprises:
    a server-chassis-specific pump connecting the supply manifold and one of the one or more server chassis.

13. The data center cooling system of claim 8, wherein the coolant in the supply manifold is at a substantially similar temperature as the liquid portion of the two-phase fluid.

14. A method for recycling a liquid portion of a used two-phase cooling fluid in an electronic rack, the method comprising:
    providing, in a supply manifold, a coolant from a source for distributing the coolant to one or more server chassis thermally coupled with one or more electronic devices;
    causing the coolant to flow through the one or more server chassis to exit in one or more exit manifolds;
    removing excessive heat from the one or more server chassis and the one or more electronic devices coupled therewith by transforming the coolant into the two-phase cooling fluid comprising a liquid portion and a non-liquid portion;

transferring the two-phase cooling fluid to a separator disposed on an end of the one or more exit manifolds; and returning, via a pump-free conduit connecting the separator and the supply manifold using gravity, the liquid portion of the two-phase fluid to the supply manifold to join the coolant for a next heat removal cycle, wherein providing the coolant from the source for distributing the coolant to the one or more server chassis further comprises:

providing, in a pump-free supply line connecting the supply manifold and one of the one or more server chassis, a portion of the coolant from the supply manifold to the one of the one or more server chassis using gravity.

15. The method of claim 14, wherein providing the coolant from the source for distributing the coolant to the one or more server chassis further comprises:

powering, by a pump connecting a distribution conduit and the supply manifold, the coolant through the distribution conduit and the one or more exit manifolds of the one or more server chassis.

16. The method of claim 15, further comprising:

causing, by the pump, a relatively low pressure in the supply manifold to draw the liquid portion of the two-phase fluid from the separator.

17. The method of claim 14, further comprising:

collecting, in a condenser conduit coupled to the separator, the non-liquid portion; and transferring the non-liquid portion for heat exchange, wherein the non-liquid portion is in a gaseous matter state.

18. The method of claim 14, wherein providing the coolant from the source for distributing the coolant to the one or more server chassis further comprises:

powering, by a server-chassis-specific pump connecting the supply manifold and one of the one or more server chassis, a portion of the coolant from the supply manifold through the one of the one or more server chassis.

* * * * *